United States Patent
Ndip

(10) Patent No.: US 10,566,679 B2
(45) Date of Patent: Feb. 18, 2020

(54) RIBBON BOND ANTENNAS

(71) Applicant: Fraunhofer-Gesellschaft zur Foerderung der angewandten Forschung e.V., Munich (DE)

(72) Inventor: Ivan Ndip, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 228 days.

(21) Appl. No.: 15/861,361

(22) Filed: Jan. 3, 2018

(65) Prior Publication Data

US 2018/0191054 A1    Jul. 5, 2018

(30) Foreign Application Priority Data

Jan. 5, 2017 (DE) .................. 10 2017 200 130

(51) Int. Cl.
| | |
|---|---|
| *H01Q 1/38* | (2006.01) |
| *H01Q 1/22* | (2006.01) |
| *H01L 23/00* | (2006.01) |
| *H01Q 23/00* | (2006.01) |

(52) U.S. Cl.
CPC ........... *H01Q 1/2283* (2013.01); *H01L 24/04* (2013.01); *H01L 24/45* (2013.01); *H01Q 23/00* (2013.01); *H01L 2224/45014* (2013.01); *H01L 2224/48091* (2013.01); *H01L 2224/48249* (2013.01); *H01L 2924/01013* (2013.01); *H01L 2924/01029* (2013.01); *H01L 2924/1421* (2013.01)

(58) Field of Classification Search
CPC ....... H01Q 1/2283; H01L 24/04; H01L 24/45; H01L 23/00; H01L 2224/45014; H01L 2224/48091; H01L 2224/48249; H01L 2924/01013; H01L 2924/01029; H01L 2924/1421

See application file for complete search history.

(56) References Cited

U.S. PATENT DOCUMENTS

| | | | |
|---|---|---|---|
| 7,295,161 | B2 | 11/2007 | Gaucher et al. |
| 7,580,001 | B2 | 8/2009 | Tsai et al. |
| 7,586,193 | B2 | 9/2009 | Weste |
| 7,768,456 | B2 | 8/2010 | Tsutsumi et al. |
| 8,599,092 | B2 | 12/2013 | Washiro |
| 2006/0028378 | A1 | 2/2006 | Gaucher et al. |
| 2007/0170560 | A1 | 7/2007 | Gaucher et al. |
| 2008/0205495 | A1 | 8/2008 | Trott |

(Continued)

FOREIGN PATENT DOCUMENTS

| | | |
|---|---|---|
| WO | 0021030 A1 | 4/2000 |
| WO | 0065691 A1 | 11/2000 |

(Continued)

*Primary Examiner* — Graham P Smith
(74) *Attorney, Agent, or Firm* — Perkins Coie LLP; Michael A. Glenn

(57) ABSTRACT

An antenna apparatus includes a substrate including a first main side and a second main side arranged opposite thereto. The antenna apparatus further includes a first and a second fixing region arranged at the first main side. The antenna apparatus includes a ribbon connecting the first fixing region and the second fixing region, which is at least regionally spaced apart from the substrate. Furthermore, the antenna apparatus includes a metallization arranged at the second main side, which is arranged opposite to at least one of the first fixing region, the second fixing region and the ribbon.

18 Claims, 14 Drawing Sheets

(56) References Cited

U.S. PATENT DOCUMENTS

| | | | |
|---|---|---|---|
| 2008/0291107 | A1 | 11/2008 | Tsai et al. |
| 2014/0138446 | A1 | 5/2014 | Wu et al. |
| 2014/0253391 | A1 | 9/2014 | Yen |
| 2014/0325150 | A1 | 10/2014 | Hashimoto et al. |

FOREIGN PATENT DOCUMENTS

| | | | |
|---|---|---|---|
| WO | 2011025241 | A2 | 3/2011 |
| WO | 2014049088 | A1 | 4/2014 |
| WO | 2014088210 | A1 | 6/2014 |

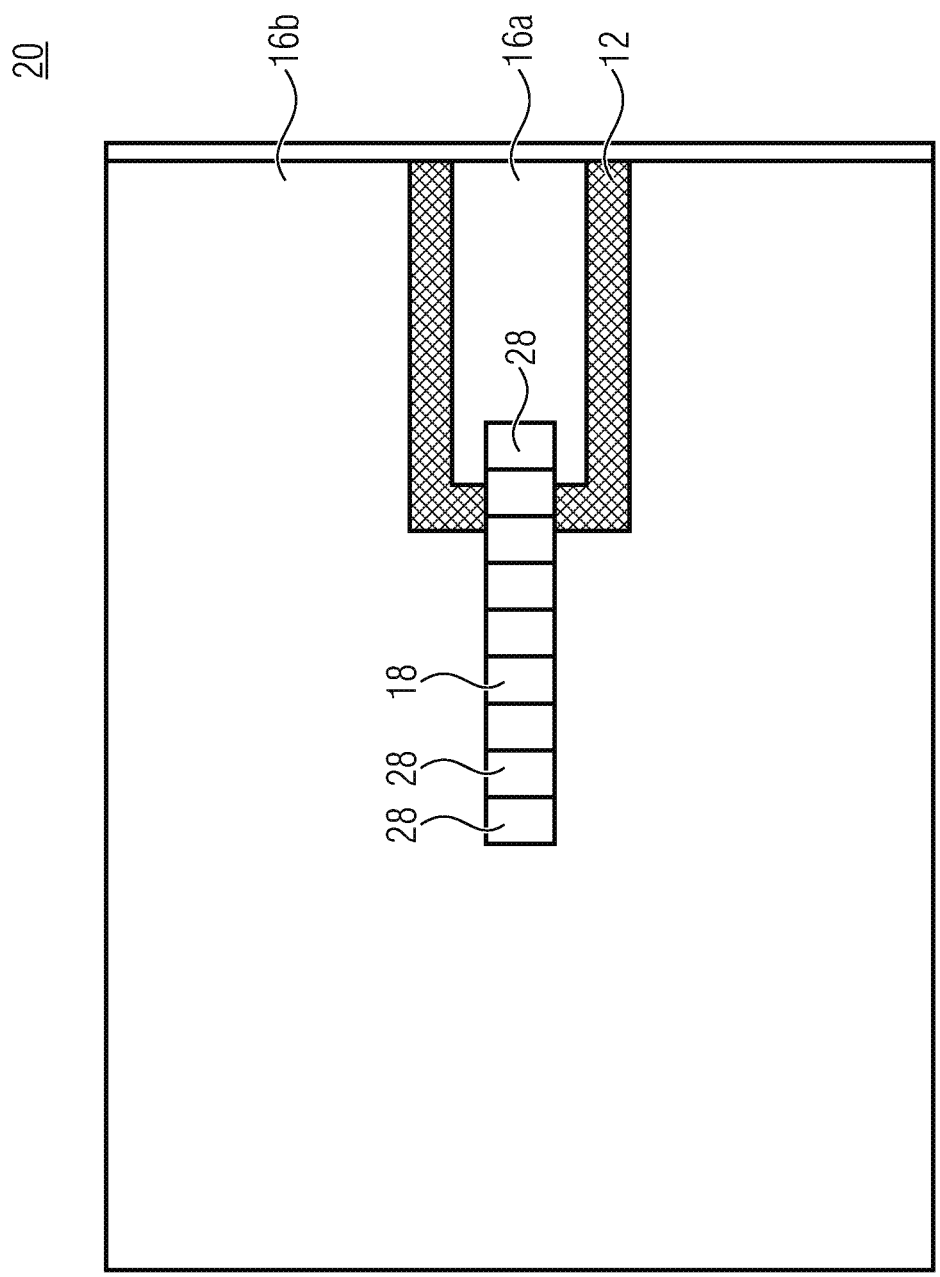

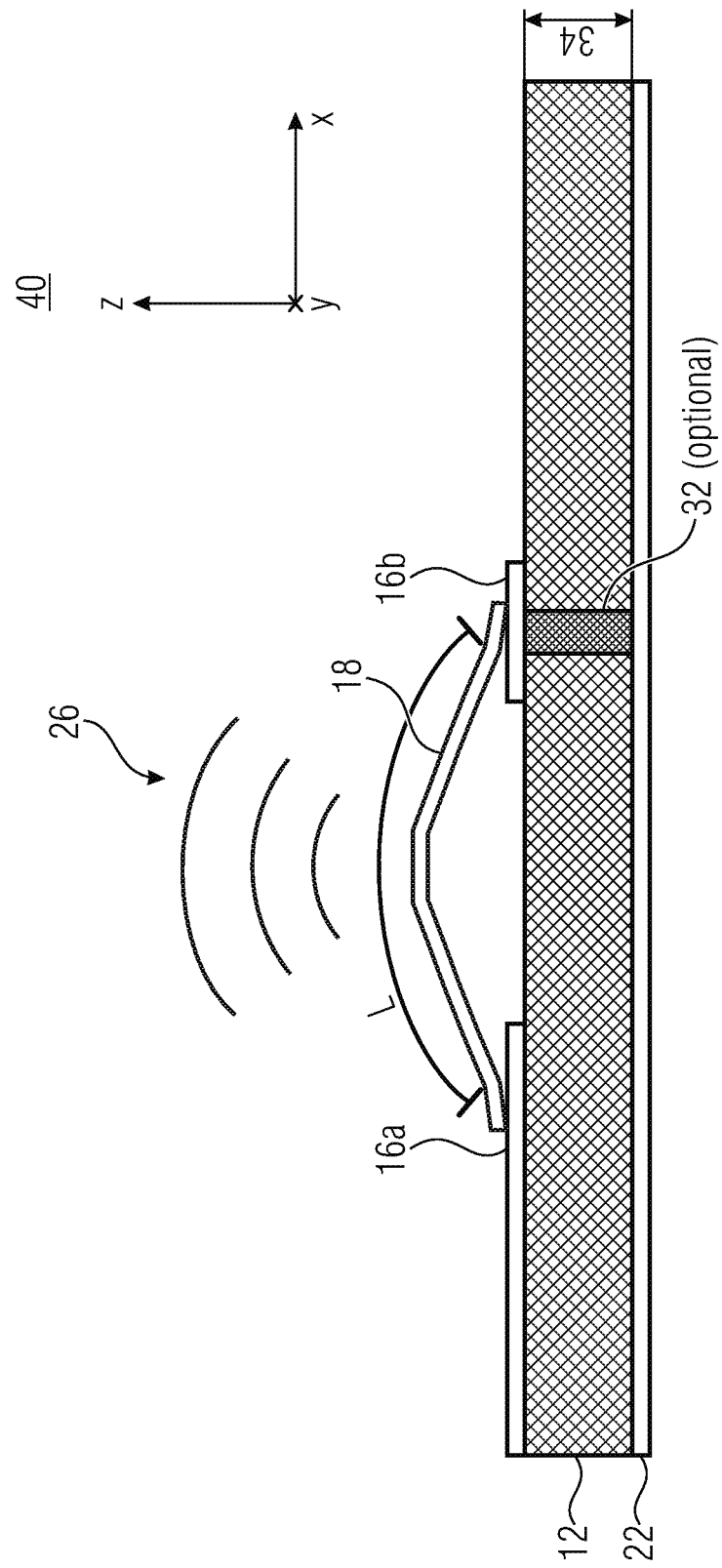

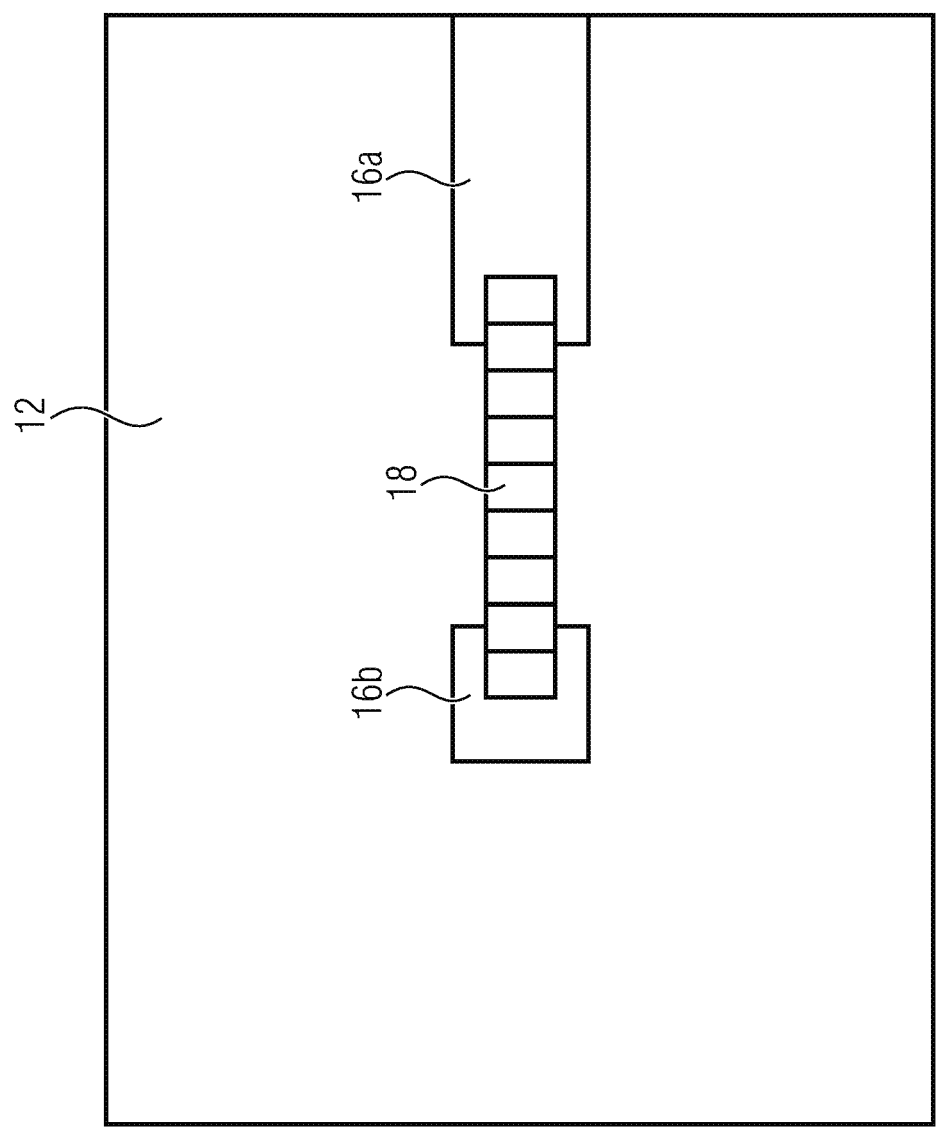

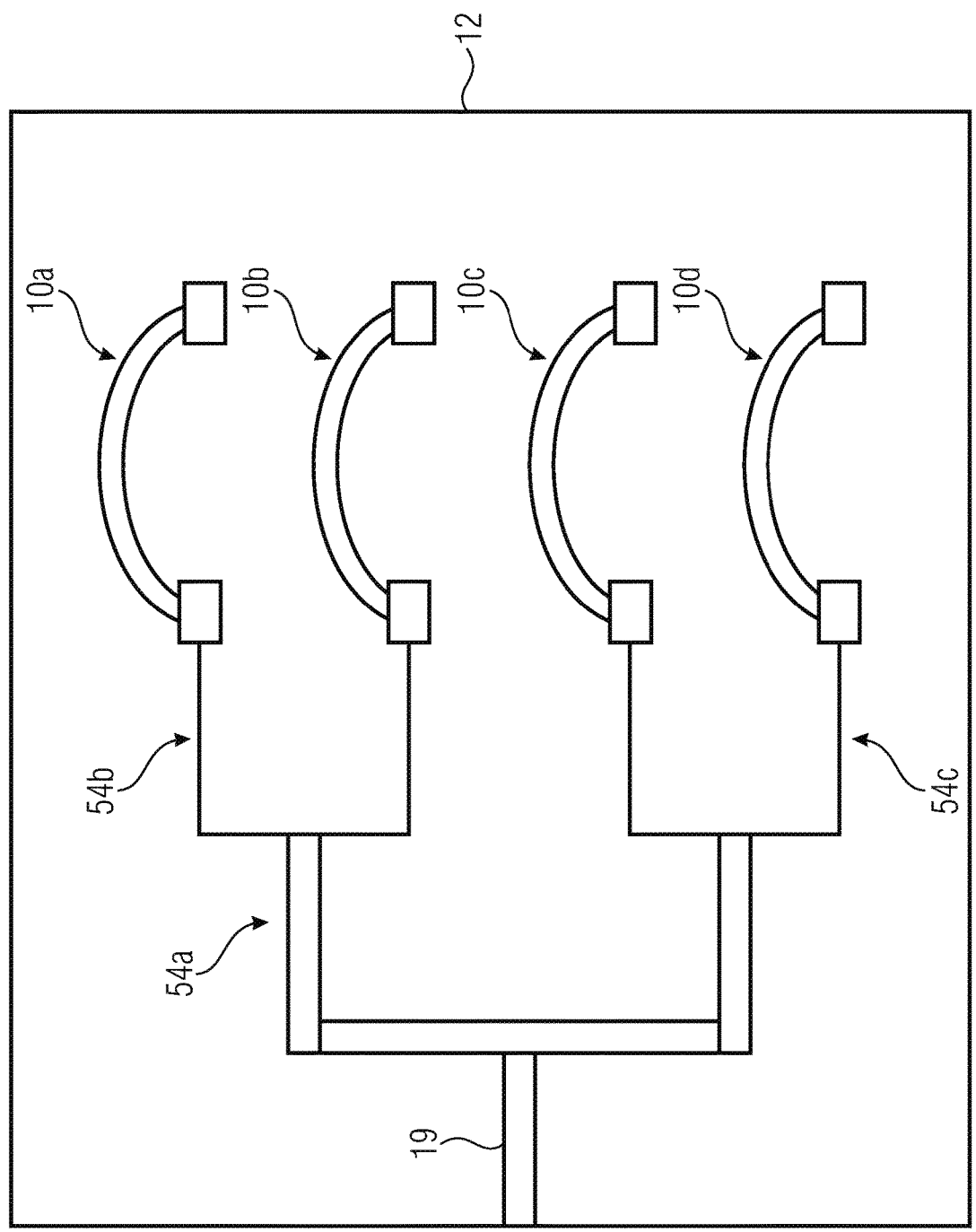

RIBBON BOND ANTENNAS

CROSS-REFERENCE TO RELATED APPLICATION

This application claims priority from German Patent Application No. DE 10 2017 200 130.5, which was filed on Jan. 5, 2017, and is incorporated herein in its entirety by reference.

BACKGROUND OF THE INVENTION

The present invention relates to antenna apparatuses having ribbons. Furthermore, the present invention relates to ribbon bond antennas (RBAs).

At higher frequencies, e.g., in the millimeter wavelength range and higher, the radiation efficiency of planar antennas such as patch antennas, dipole antennas, monopole antennas, etc. suffers greatly from losses in connection with dielectrics used in the manufacturing of antennas. These include dielectric losses and surface wave losses.

Furthermore, the interconnection between the radio-frequency (RF) chip and an antenna on the interposer or on the circuit board causes signal integrity problems, which affects the system performance.

Therefore, possibilities to radiate signals with a high efficiency would be desirable.

SUMMARY

According to an embodiment, an antenna apparatus may have: a substrate comprising a first main side and a second main side arranged opposite thereto; a first and a second fixing region arranged at the first main side; a ribbon connecting the first fixing region and the second fixing region, which is at least regionally spaced apart from the substrate; and a metallization arranged at the second main side, which is arranged opposite to at least one of the first fixing region, the second fixing region and the ribbon.

Another embodiment may have an antenna array having at least one inventive antenna apparatus, wherein the ribbon is a first ribbon, the antenna array comprising at least one second ribbon interacting with the first ribbon.

According to an embodiment, an electric circuit may have: an inventive antenna apparatus; a radio-frequency chip configured to provide a radio-frequency signal at a signal output, and arranged on the substrate of the antenna apparatus; wherein the first fixing region is electrically connected to the signal output or wherein the signal output is the first fixing region.

According to an embodiment, an antenna apparatus includes a substrate having a first main side and a second main side arranged opposite thereto. The antenna apparatus includes a first fixing region and a second fixing region arranged at the first main side. The antenna apparatus further includes a ribbon connecting the first fixing region and the second fixing region, which is at least regionally separated from the substrate. The antenna apparatus includes a metallization arranged at the second main side, which is arranged opposite to at least one of the first fixing region, the second fixing region, and the ribbon. This enables efficient radiation of a radio signal via the ribbon. The at least regional spacing of the ribbon from the substrate enables a reduction or avoidance of surface-wave losses and/or a reduction of dielectric losses. At the same time, a return current path of the antenna apparatus may be realized with the metallization at the second main side.

According to an embodiment, the antenna apparatus is configured to emit a radio signal with the ribbon in response to an electric signal applied at the first fixing region, a wavelength range of the radio signal being affected by a length of the ribbon. This enables avoiding an arrangement of additional explicit antenna structures, which means that generation of the radio signal is essentially carried out by the ribbon. This enables a space-efficient realization of an antenna on the substrate.

According to another embodiment, the metallization at the second main side is arranged opposite to the first fixing region, the second fixing region and the ribbon. This makes it possible to shield, with respect to a radio signal generated with the antenna apparatus, components arranged on a side of the metallization facing away from the ribbon in order to obtain good properties with respect to the electromagnetic compatibility.

According to a further embodiment, the metallization arranged at the second main side is a reflector for a radio signal emitted by the ribbon. This enables a high radiation efficiency of the antenna apparatus.

According to a further embodiment, the second fixing region and the metallization arranged at the second main side are connected through a substrate material of the substrate by an electrically conductive structure, e.g., a via. This enables using the metallization as a galvanically connected return current path.

According to a further embodiment, a wavelength range of a radio signal emitted with the ribbon and the conductive structure is affected by a sum of a length of the ribbon and a length of the conductive structure. This makes it possible to mutually calibrate and adjust the length of the conductive structure and the length of the ribbon in order to emit the radio signal in a desired wavelength range.

According to a further embodiment, the second fixing region is configured such that it at least partially encloses the first fixing region so that the first fixing region acts as a coplanar supply line with respect to the second fixing region. This enables a small extent of parasitic radiation, a good noise radiation characteristic and a high degree of electromagnetic compatibility (EMC).

According to a further embodiment, the antenna apparatus includes a housing, in which the antenna apparatus is arranged. The antenna apparatus includes a terminal for connecting the antenna apparatus to a radio-frequency chip. This makes it possible to provide antenna apparatuses in a component-wise manner in order to bring these into connection with a radio-frequency chip only a later point in time.

Further embodiments provide an antenna array having at least one first and one second antenna apparatus. The antenna apparatuses may be connected to each other in series in order to affect a wavelength range of a radio signal emitted with the antenna array by a sum of a length of the conductor strips of the first antenna apparatus and the second antenna apparatus, or may be galvanically separated from each other and, in this case, be arranged such that the second antenna apparatus acts as a reflector antenna or as a director antenna with respect to the first antenna apparatus.

Further embodiments relate to an electric circuit having an antenna apparatus according to embodiments and a radio-frequency chip configured to provide a radio-frequency signal at a signal output and being arranged on the substrate of the antenna device. The first fixing region is electrically connected to the signal output. This enables the direct radiation of a radio-frequency signal of the radio-frequency chip with the ribbon so that the requirement of additional antenna structures may be avoided.

BRIEF DESCRIPTION OF THE DRAWINGS

Embodiments of the present invention will be detailed subsequently referring to the appended drawings, in which:

FIG. 2b shows a schematic side sectional view of the antenna apparatus of FIG. 2a;

FIG. 2c shows a schematic top view of an antenna apparatus 20 according to an embodiment, in which the ribbon is discontinuously bent in segments;

FIG. 4a shows a schematic side sectional view of an antenna apparatus according to a further embodiment, in which the second fixing region and the metallization are connected via an electrically conductive structure;

FIG. 4b shows a schematic top view of the antenna apparatus of FIG. 4a;

FIG. 8b shows a schematic view of an antenna array according to a further embodiment including four antenna apparatuses connected via a network of voltage dividers or power dividers.

DETAILED DESCRIPTION OF THE INVENTION

Figure 1:
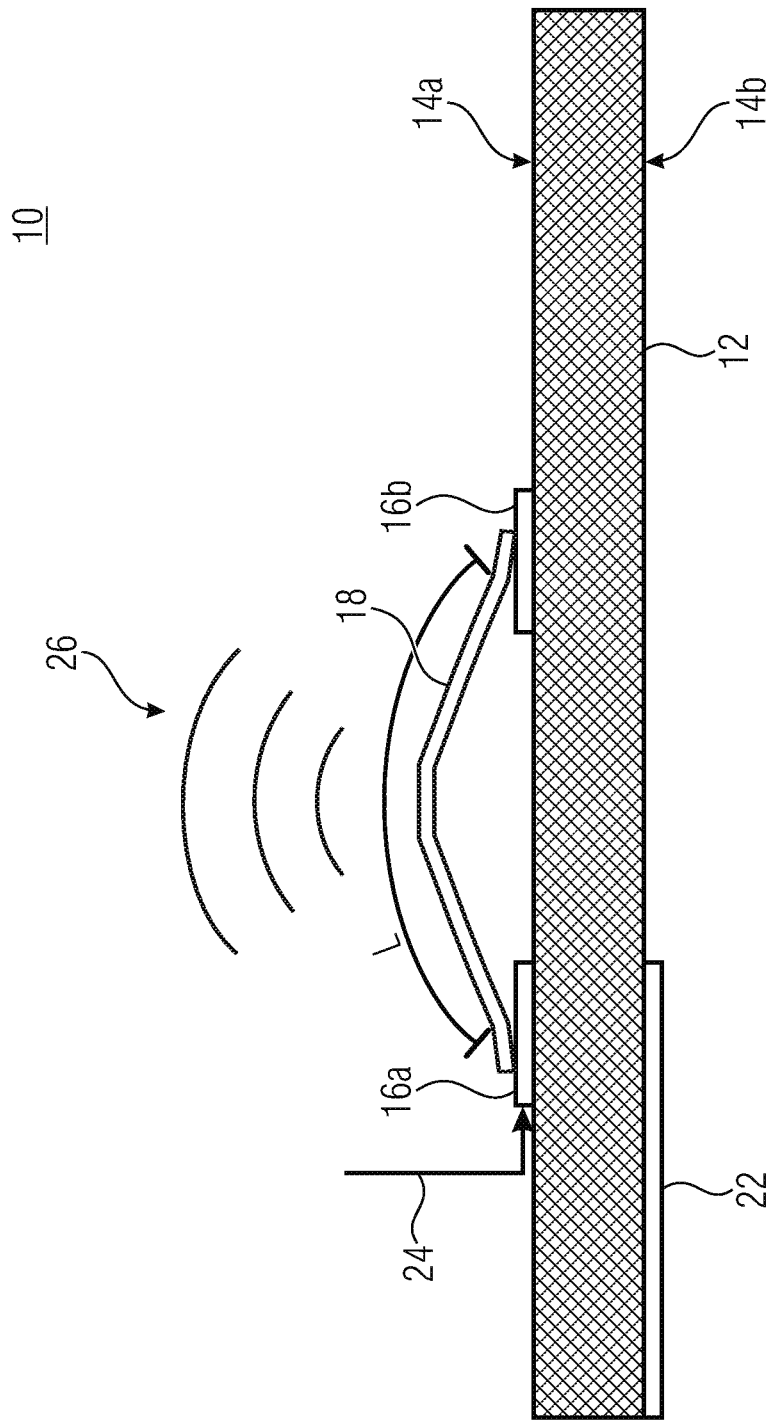
FIG. 1 shows a schematic side sectional view of an antenna apparatus according to an embodiment.

Before embodiments of the present invention will subsequently be explained in detail with reference to the drawings, it shall be pointed out that identical, functionally identical and operatively identical elements, objects and/or structures are provided in the different figures with identical reference numerals so that the description of these elements in different embodiments is interchangeable and/or mutually applicable.

Although the subsequent embodiments are described such that the antenna apparatuses may be used for radiating a radio signal, it is understood that radio signals may also be received with antenna apparatuses. Embodiments may therefore be transferred to receiving antennas without restrictions.

Embodiments described herein describe antenna apparatuses, electric circuits and antenna arrays, in which a radio signal is generated using one or several ribbons. These ribbons are also referred to as ribbon bonds. The antenna apparatus described herein may be referred to as ribbon bond antennas (RBAs).

Antenna apparatuses having ribbons may be formed in analogy to a loop, or half-loop, antenna and may be referred to as quasi-half-loop antenna. Such an antenna may include a mirror plane such as a plane which may be used for returning a current. If this plane is arranged at a side of a dielectric substrate opposite to the antenna apparatus, the term dielectric quasi-half-loop antenna may be used.

FIG. 1 shows a schematic side sectional view of an antenna apparatus 10 according to an embodiment. The antenna apparatus 10 includes a substrate 12 comprising a first main side 14a and a main side 14b arranged opposite thereto. For example, the main sides 14a and 14b may be sides having a larger surface extension compared to one or several side surfaces. For example, a plate-shaped substrate 12 may be a top side and a bottom side when the substrate 12 is arranged in a stable state in a lying manner on a table or the like. It is understood that the terms top side and bottom side are mutually exchangeable or may be substituted by terms such as lateral side when the arrangement of the substrate 12 in the space is changed. Therefore, terms such as up, down, left, right, front, back and the like are not to be understood to be limiting in the embodiments described herein, but are to merely improve the comprehensibility.

At least two fixing regions 16a and 16b for fixing electric conductors are arranged at the first main side 14a. For example, the fixing regions 16a and/or 16b may be metallizations such as bond pads, strip lines or the like, at which further structure may be arranged in a mechanical manner and/or with an electric connection, e.g., by means of an adhesive connection or a soldering connection.

The antenna apparatus 10 includes a ribbon 18 which electrically connects the fixing regions 16a and 16b. Using an alternative but synonymous term, a ribbon may also be referred to as a conductor tape. The ribbons are electrically conductive structures which may be used for transmitting electric signals, voltages and/or currents. This means that the fixing regions 16a and 16b are electrically connected by the ribbon 18. The ribbon 18 is at least regionally spaced apart from the substrate 12. For this, the ribbon 18 may, e.g., be arranged as a bridge structure or an arch structure between the fixing regions 16a and 16b. The ribbon 18 may be in direct mechanical contact to the fixing regions 16a and/or 16b and, e.g., may not be spaced apart from the substrate 12 at this position. In this way, e.g., the fixing regions 16a and/or 16b may be integrated into a surface of the substrate 12. Alternatively, at least one of the fixing regions 16a or 16b may already provide a distance to the substrate 12. Alternatively or additionally, a mechanical structure providing and maintaining the mechanical connection may lead to a spacing between the fixing regions 16a and/or 16b, e.g., a solder material arranged between the ribbon 18 and at least one of the fixing regions 16a or 16b so that the ribbon 18 may also be entirely spaced apart from the substrate 12. The at least partial or regional spacing of the ribbon from the substrate enables reducing or avoiding surface wave losses and/or reducing dielectric losses. Furthermore, a spatial 3D radiation may be obtained.

The antenna apparatus 10 further includes a metallization 22 which is arranged at the second main side 14b. The metallization 22 may include any electrically conductive metal material such as copper, gold, aluminum or the like, or a combination including at least one metal material. The metallization 22 may be implemented as a layer which is at least regionally formed at the main side 14b. This means that the metallization 22 may, but does not have to, cover the entire second main side 14b. Other parts of the second main side 14b of the substrate 12 may remain uncovered by the metallization 22. The metallization 22 is formed, i.e., arranged, opposite to the fixing region 16a, and/or opposite to the fixing region 16b, and/or opposite to at least one portion of the ribbon 18 or the entire ribbon 18. Opposite is to be understood as an arrangement of the metallization 22 along the surface normal of the substrate 12 at the location of the fixing region 16a and/or 16b or of the ribbon 18. Alternatively, an arrangement of the metallization 22 in such a way that electromagnetic fields, e.g., radio waves, emitted by the mentioned components interact with the metallization 22, e.g., as a reflector or a return current path, is sufficient for the requirement of the opposite arrangement.

An electric signal 24 may be applied at the fixing region 16a or the fixing region 16b. For example, the electric signal 24 may be a radio-frequency signal. In connection with the herein described embodiments, a signal having a frequency of at least 150 kHz is understood to be radio-frequent. Advantageously, the electric signal 24 comprises a frequency of at least 1 MHz and may particularly advantageously be used for generating so-called microwaves/millimeter waves, e.g., comprising a frequency in a frequency band of at least 30 GHz to at most 300 GHz, advantageously between 30 GHz and 80 GHz, or particularly advantageously between 60 GHz and 80 GHz. Other frequency ranges such as terahertz ranges may also be realized. Millimeter waves are understood to be wavelengths in a range of at least 1 mm and at most 10 mm, which correspond to a frequency of the electric signal 24 via the correlation $\lambda=c/f$.

The antenna apparatus 10 is configured to emit a radio signal 26 which is based on the electric signal 24. For example, the same may be obtained by receiving the electric signal 24 at the fixing region 16a, transmitting the electric signal 24 to the fixing region 16b while simultaneously generating the radio signal 26 as well as by an effect of the metallization 22 as a return path.

One dimensioning of the length L of the ribbon 18 may, e.g., be carried out in a connection of approx. $L=\lambda/8$, $\lambda/4$, $\lambda/2$, $A\lambda$, $2\lambda$, $4\lambda$ or the like, wherein $\lambda$ is a wavelength of the radio signal 26. The antenna device 10 is advantageously implemented as a $\lambda/2$ radiator or as a $\lambda/4$ radiator. With regards to the correlation between the wavelength $\lambda$ and the total length $L_{tot}$, a tolerance range of no more than 70%, no more than 50% or no more than 30% may be applicable. In particular in the millimeter wavelength range, an exact dimensioning of the length L of the ribbon 18 with respect to a frequency band of the radio signal 26 to be provided by the antenna device 10 may be advantageous so that a tolerance range of no more than 30%, no more than 20% or no more than 10% may be applicable.

Although the metallization 22 is illustrated such that the same is arranged opposite to the fixing region 16a, alternatively or additionally, the same be arranged opposite to the ribbon 18 and/or the fixing region 16b in order to enable an electromagnetic coupling of the radio signal 26 into the metallization 22. Through the electromagnetic coupling into the metallization 22, a return current path with respect to the electrical signal 24 may be obtained.

The antenna apparatus 10 represents a ribbon antenna, or ribbon bond antenna, which means that the antenna function is at least partially implemented by (line) ribbons as may be used for the bonding of components. The ribbon 18 may also be referred to as ribbon bond. The antenna apparatus 10 may be a ribbon bond antenna (RBA). The RBA may be fed, i.e., be supplied with the electric signal 24, in any way. For example, in this regard, the fixing region 16a or the fixing region 16b may be supplied with the electric signal in a coplanar manner. Alternatively or additionally, one of the fixing regions 16a and/16b may be connected with a strip line (micro strip) in order to obtain the electric signal 24. Alternatively or additionally, the electrical signal 24 may be fed by means of an electromagnetic coupling, e.g., by a so-called aperture coupling (aperture feed) or by a near-field feed (proximity feed) and/or by vertical contacting, e.g., using a via. The antenna apparatus 10 may include a terminal for a vertical feed or a horizontal feed. The electric signal 24 may be received via the terminal in order to provide a radio signal 26. Coupling the signal 24 to the antenna may be carried out in a vertical manner such as via a proximity feed, an aperture-coupled feed, a probe feed or the like. Alternatively, the antenna apparatus may also be horizontally excited via lines. This means that, although it is illustrated in FIG. 1 that the electric signal is guided to the fixing region 16a, the electric signal 24 may also be guided to the fixing region 16b in order to feed the antenna apparatus 10.

The radio signal 26 could also be generated by means of a bond wire. Like conductor tapes, bond wires used as an emitting antenna may also enable avoiding an arrangement of an additional antenna on the interposer of the circuit board. Simultaneously, they may be used for connecting a chip arrangement and as an antenna. Compared to using bond wires, however, conductor tapes have further advantages such as a greater insensitivity to process parameters and process changes, which means that the conductor tapes may be manufactured and arranged with greater precision. Furthermore, the structure of the ribbon comprises a greater stability as compared to the structure of a wire. Furthermore, conductor tapes have high radiation efficiency since they comprise lower metallization losses than bond wires. Therefore, they may be operated with a better radiation performance, which exceeds that of bond wires or bond wire antennas (BWA). These advantages are achieved, among other things, by the fact that the ribbon 18 comprises a changed geometry compared to an approximately rotation-symmetric bond wire. An axial extension along the length L, a lateral dimension, e.g., referred to as width, perpendicular to this, as well as a height expansion or thickness expansion perpendicular to the axial and lateral extensions may comprise different aspect ratios. Compared to cylindrically configured bond wires, ribbons may be configured to be flat. The length L of the ribbon 18 may comprise any value and may be dimensioned in connection with the above values of the frequency range to be emitted or to be received.

Figure 2A:
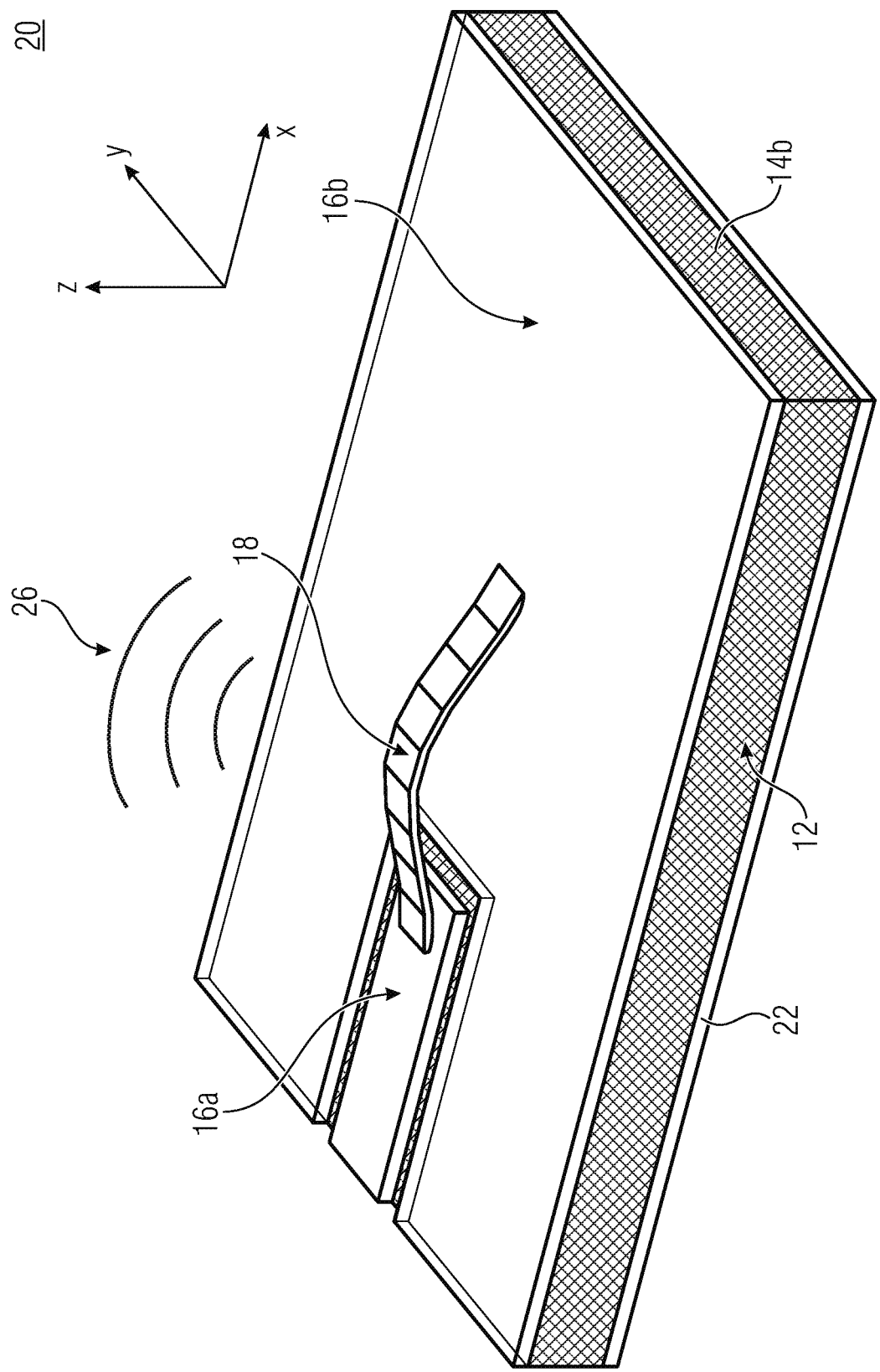
FIG. 2a shows a schematic perspective view of an antenna apparatus according to a further embodiment, in which a second fixing region is implemented such that it at least partially encloses a first fixing region.

FIG. 2a shows a schematic perspective view of an antenna apparatus 20 according to a further embodiment. Compared to the antenna apparatus 10, the fixing region 16b is implemented such that it at least partially encloses the fixing region 16a. This makes it possible that the fixing region 16b and the fixing region 16a form a coplanar arrangement of an outgoing supply line and returning supply line. Advantageously, the fixing region 16b encloses the fixing region 16a at no less than two or at no less than three sides of the planar arrangement. Particularly advantageously, the fixing region 16a is not enclosed by the fixing region 16b at no more than one side, wherein the number of sides refers to directions in a plane in which the fixing regions 16a and 16b are arranged. For example, at least one of the main sides of the substrate 12 may be arranged in parallel to a x/y plane, while the ribbon 18 lifts off perpendicularly thereto at least regionally from the substrate 12, i.e., is spaced apart, along a z direction of a Cartesian coordinate system. The sides at which the fixing region 16a is enclosed by the fixing region 16b may, e.g., be positive and/or negative x directions and/or y directions. An arrangement of the fixing regions 16a and 16b as coplanar supply lines enables a high extent of shielding against neighboring circuit components.

Irrespective of this, the metallization 22 may be implemented to be flat and may be arranged, e.g., opposite to the fixing regions 16a and 16b and the ribbon 18. Based on the flat configuration of the fixing region 16b, the metallization 22 may also extend across the entire surface of the substrate 12. For example, if the fixing region 16b is configured with a small surface expansion, such as described in connection with the antenna apparatus 10, the metallization 22 may also comprise a small surface expansion. Arranging the metallization 22 opposite to the components involved in the radiation, i.e., opposite to the fixing regions 16a and 16b and the ribbon 18, enables the implementation of a reflector. The effect of the metallization 22 as a reflector enables a high radiation efficiency of the radio signal 26 in a direction of the substrate 12 facing away from the metallization 22. Arranging the metallization 22 opposite to several components enables shielding further components arranged on a side of the metallization facing away from the ribbon with respect to a radio signal generated with the antenna apparatus so that good properties may be obtained with respect to the electromagnetic compatibility.

Alternatively to a metallization 22 implemented to be flat and to be a reflector, it is also possible to implement the metallization 22 in a discontinuous manner across the main side 14b of the substrate 12. In this way, discontinuous structures such as recesses may be used in order to implement antenna structures. In this way, e.g., a slit-shaped recess may be used in the metallization 22 in order to form a slit antenna so that the radio signal may also be emitted in a direction of the substrate 12 facing away from the ribbon 18.

In other words, the fixing region 16a may also be referred to as a coplanar feed line. The metallization 22 may also be used as a reflector or reference potential (ground plane). The fixing region 16b may also be used as a return line of the feed current flowing through the ribbon 18.

Figure 2B:
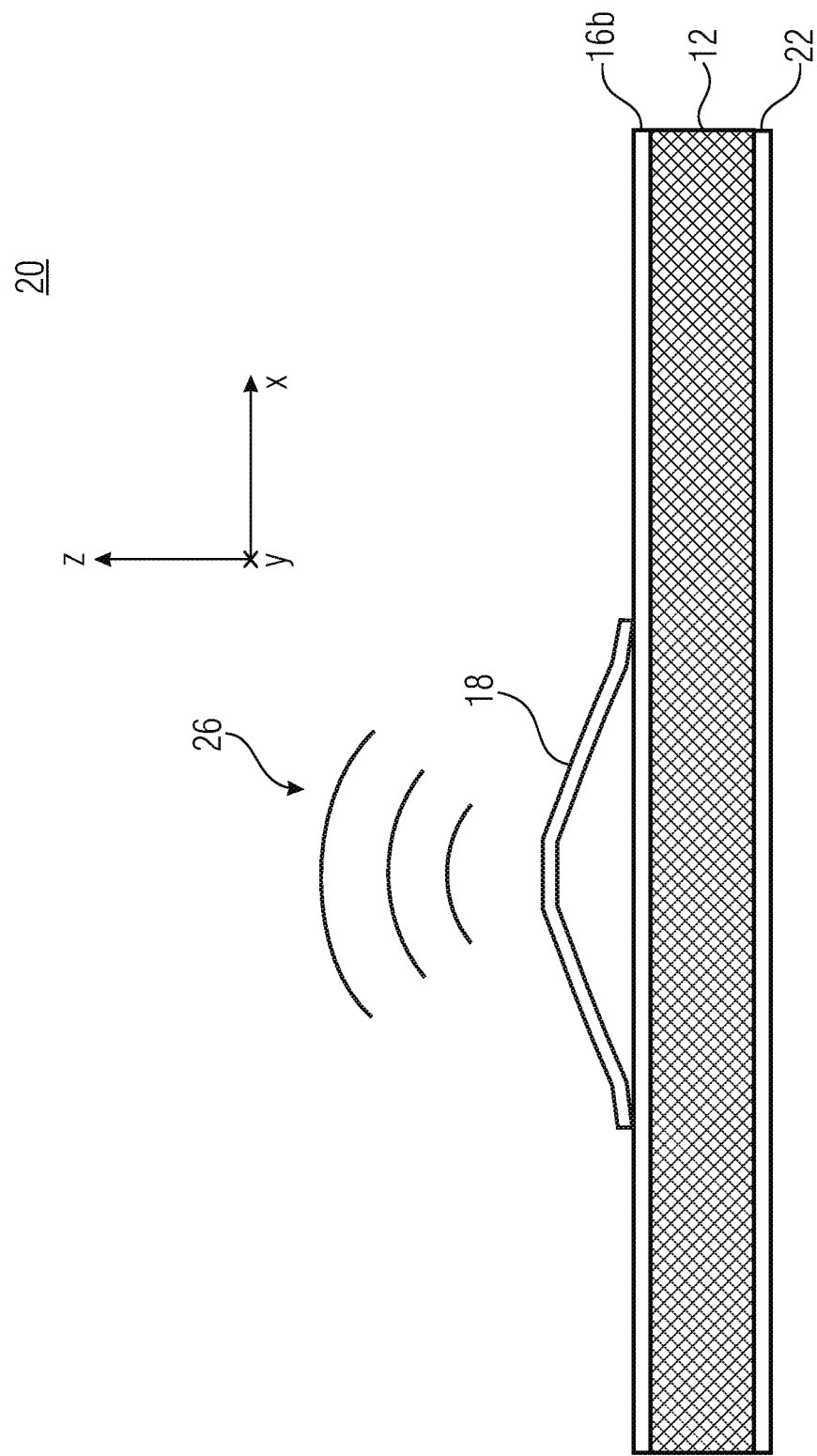

FIG. 2b shows a schematic side sectional view of the antenna apparatus 20. Due to at least regionally spacing apart the ribbon 18 from the substrate 12, a three-dimensional radiation of the radio signal 26 may be obtained.

FIG. 2c shows a schematic top view of the antenna apparatus 20. The conductor tape 18 may be curved in segments 28 in a segment-wise manner, i.e., be discontinuously curved or bent. Alternatively, the conductor tape 18 may also comprise a continuous curvature.

Figure 3:
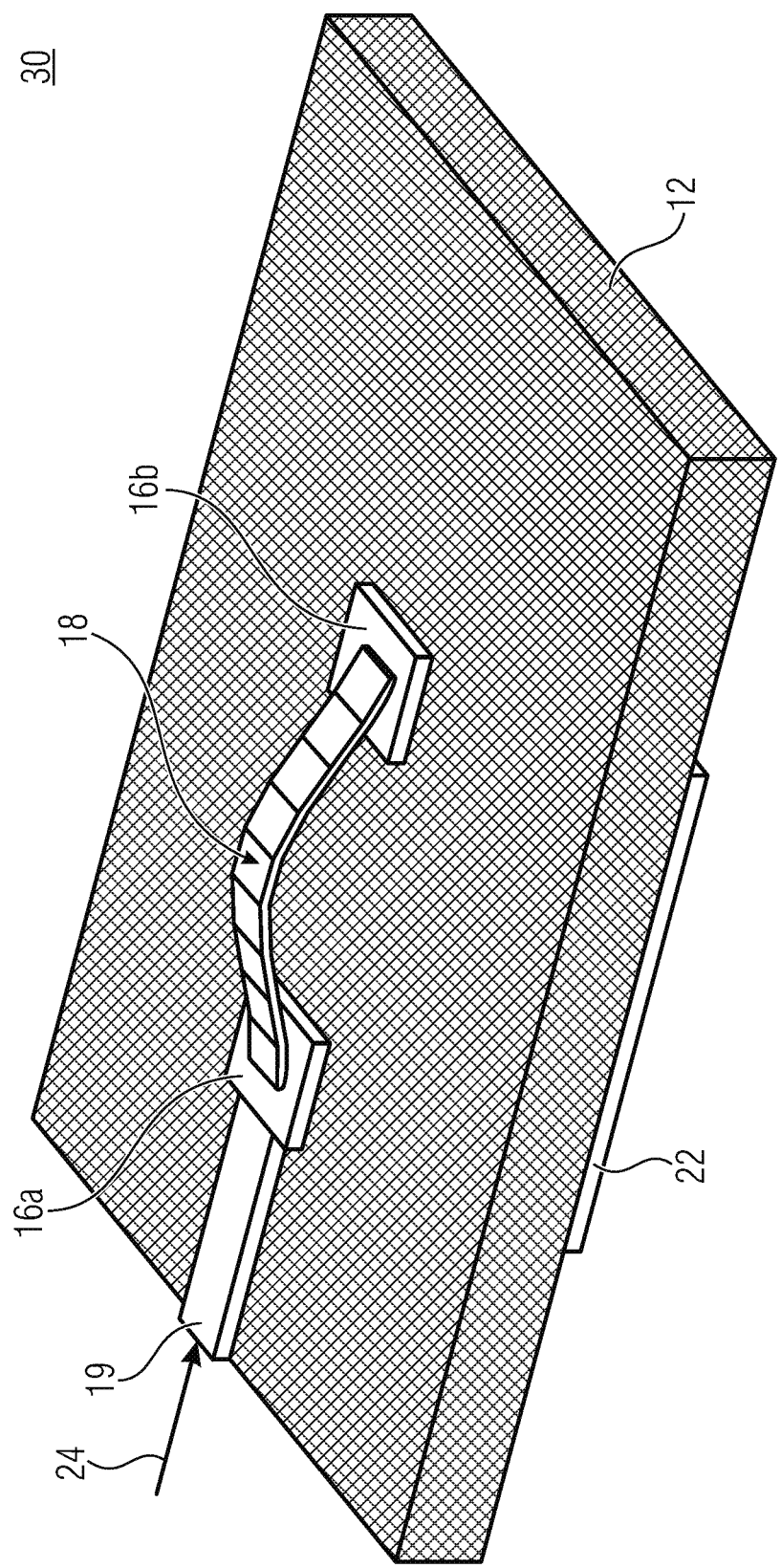
FIG. 3 shows a schematic perspective view of an antenna apparatus according to a further embodiment, in which a rear-side metallization is arranged opposite to a ribbon of the antenna apparatus.

FIG. 3 shows a schematic perspective view of an antenna apparatus 30 according to a further embodiment, in which, compared to the antenna apparatus 10 of FIG. 1, the metallization 22 is arranged opposite to the ribbon 18. Only the dielectric substrate 12 is arranged in a center of the ribbon 18 between the metallization 22 and the ribbon. Furthermore, the fixing region 16a may be connected to a supply line 19. The supply line 19 may be arranged on, at or in the substrate 12 and may enable a so-called horizontal supply. The supply line 19 may be used as an electric terminal to the antenna apparatus 10 or may be connected to such a terminal. An impedance jump or an impedance change between the supply line 19 and the fixing region 16a may at least affect a reflection coefficient of the antenna apparatus 10. Advantageously, the supply line 19 comprises a smaller width than the fixing region 16a so that the fixing region 16a acts with a low impedance with respect to the supply line 19. The supply line 19 may also be arranged at other antenna apparatuses according to the embodiments described herein.

FIG. 4a shows a schematic side sectional view of an antenna apparatus 40 according to a further embodiment, in which the fixing region 16b and the metallization 22 are connected by an electrically conductive structure 32. This means that the fixing region 16b and the metallization 22 are electrically connected via the electrically conductive connection 32. The electrically conductive structure 32 may, e.g., be a via. The electrically conductive structure 32 may extend through the substrate 12, or the substrate material. The metallization 22 may be employed as a return line, reference potential or ground plate. The wavelength range of the radio signal 26 may also be affected by an expansion or length 34 of the electrically conductive structure 32. The performance of the antenna may be affected by the conductivity, or a resistance value, of the electrically conducive structure 32 and by its geometric dimensions.

For example, the length 34 may extend along the z direction through the substrate 12 or through a substrate material. As discussed above, the wavelength range may also be affected by an expansion of the fixing region 16a or of the lead to the ribbon 18, e.g., along the x direction. This means that an emitted wavelength or wavelength range may be affected by the sum of the expansions of at least two components including the ribbon 18 and at least one of the fixing region 16a and the electrically conductive structure 32. The wavelength range may also be affected by an expansion of the fixing region 16b along the z direction.

In other words, the antenna apparatus 40 may include a strip line as a fixing region 16a, and the ribbon 18 may be connected via the electrically conductive structure 32 to the metallization 22 which serves as a return current path of the ribbon 18. The configuration of the antenna apparatus 40 may be referred to as quasi half-loop RBA. The antenna apparatus 40 may also be configured without the electrically conductive structure 32, wherein the return of the current and/or the coupling of the antenna apparatus 40 to a reference potential may be carried out by a coupling through the dielectric material of the substrate 12. In other words, the electrically conductive structure 32 may be part of the antenna.

FIG. 4b shows a schematic top view of the antenna apparatus 40, which is implemented without the electrically conductive structure 32 described in connection with FIG. 4a.

Figure 5A:
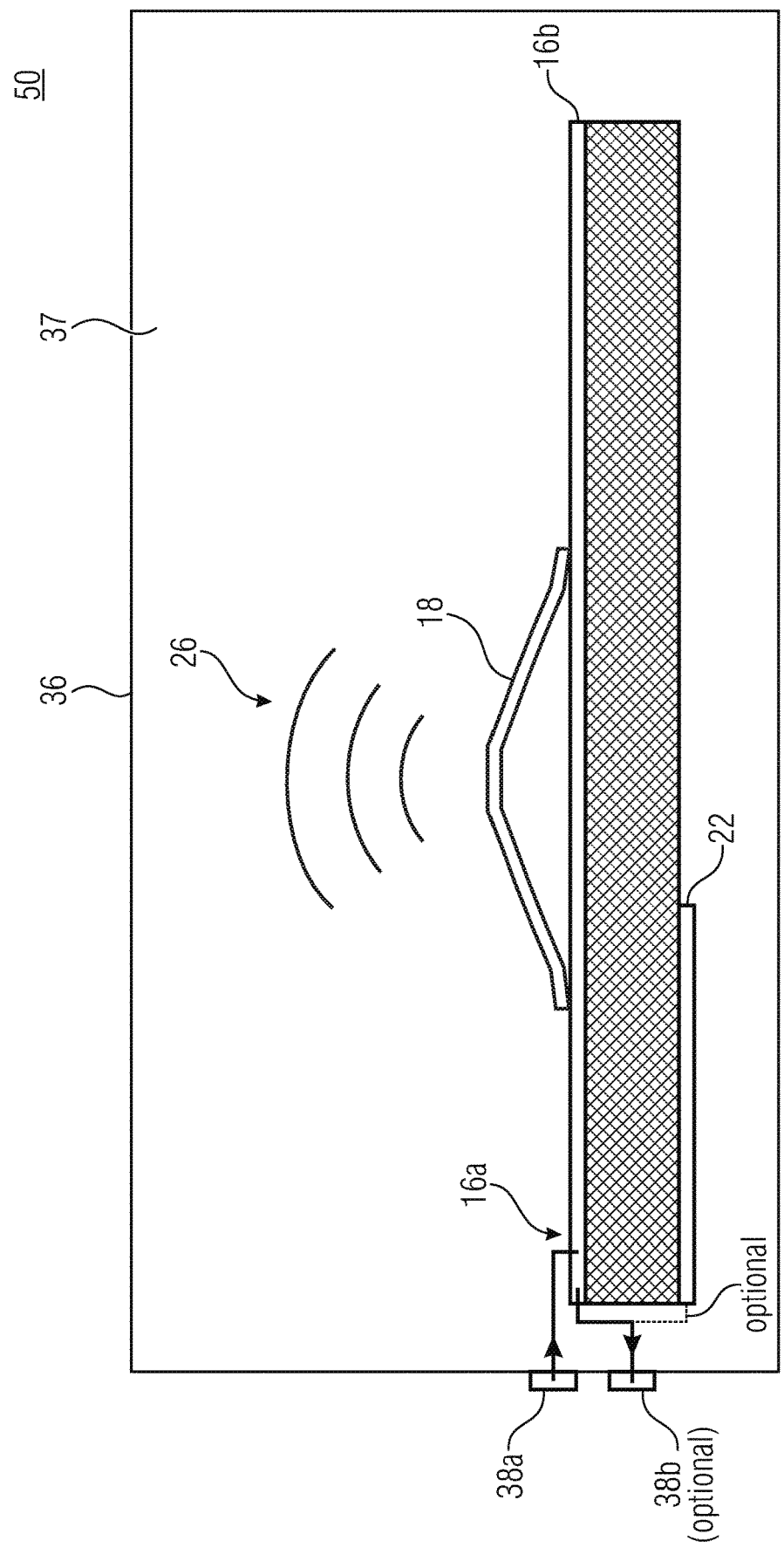
FIG. 5a shows a schematic side sectional view of an antenna apparatus according to an embodiment, comprising a housing.

FIG. 5a shows a schematic side sectional view of an antenna apparatus 50 according to an embodiment, comprising a housing 36. The housing 36 is formed including at least regionally a dielectric or electrically insulating material in order to enable an exit of the radio signal 26 from the housing 36. For example, the housing 36 may include a plastic material or a glass material. The plastic material may be arranged during dicing or encapsulation of the antenna apparatus 50 out of a wafer. The antenna apparatus 10 may be arranged in the interior of the housing 36. Alternatively or additionally, another antenna apparatus according to the embodiments described herein, at least one antenna array and/or at least one electric circuit according to the embodiments described herein may be arranged in the interior of the housing 36. An interior volume 37 of the housing 36 may be at least partially filled with a gas such as air, or a material with a low dielectric constant, or a material leading to a low performance loss.

The housing 36 includes a terminal 38a connected to the fixing region 16a. The terminal 38a is configured to be connected to a signal output of a radio-frequency chip. This means that, for example, the radio-frequency signal 24 may be received via the terminal 38a. The housing 36 may comprise a further terminal 38b connected to the fixing region 16b or to the metallization 22. For example, the terminal 38b is connected with an electric line configured as a return line, which may be implemented by the fixing region 16b or which may be implemented by the metallization 22, as previously described.

Figure 5B:
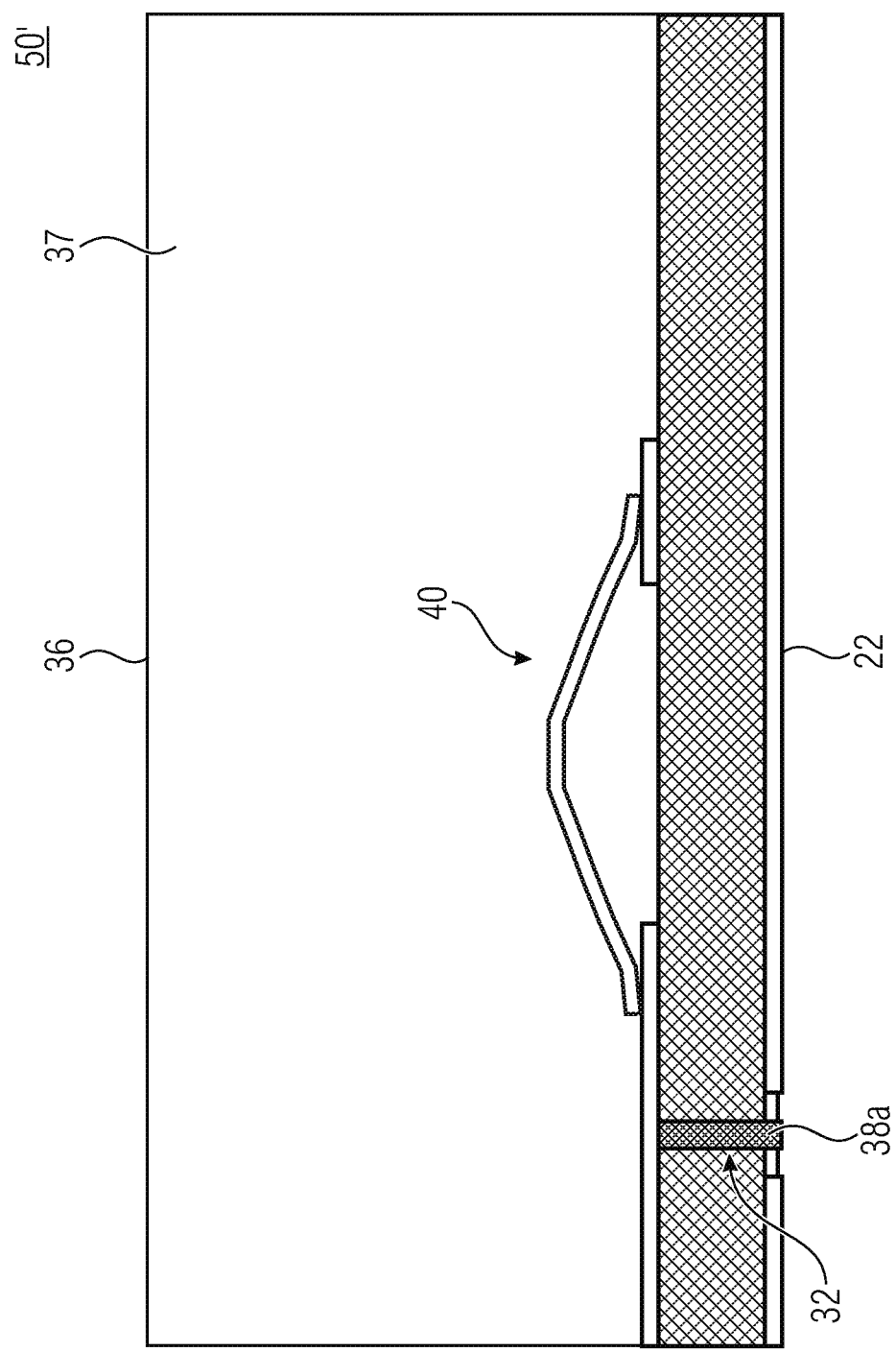
FIG. 5b shows a schematic side sectional view of an antenna apparatus according to an embodiment, comprising the housing and in which the metallization is connected to a wall of the housing or forms the wall.

FIG. 5b shows a schematic side sectional view of an antenna apparatus 50' according to an embodiment, comprising the housing 36 having, e.g., the antenna apparatus 40 arranged in its interior 37. Alternatively or additionally, other antenna apparatus, antenna arrays and/or electric circuits may be arranged. The metallization 22 may be connected to a wall of the housing or may form the wall in order to enable a contacting of the metallization to other components in a simple manner. The terminal 38a may be connected to the electrically conductive structure 32, which is implemented, e.g., as a via. The terminal 38a may serve for providing a vertical connection to the antenna apparatus 10, e.g., at the fixing region 16a in order to excite the antenna apparatus 40. Thus, the terminal 38a may provide a contact to the surrounding area of the antenna apparatus 50'.

Figure 5C:
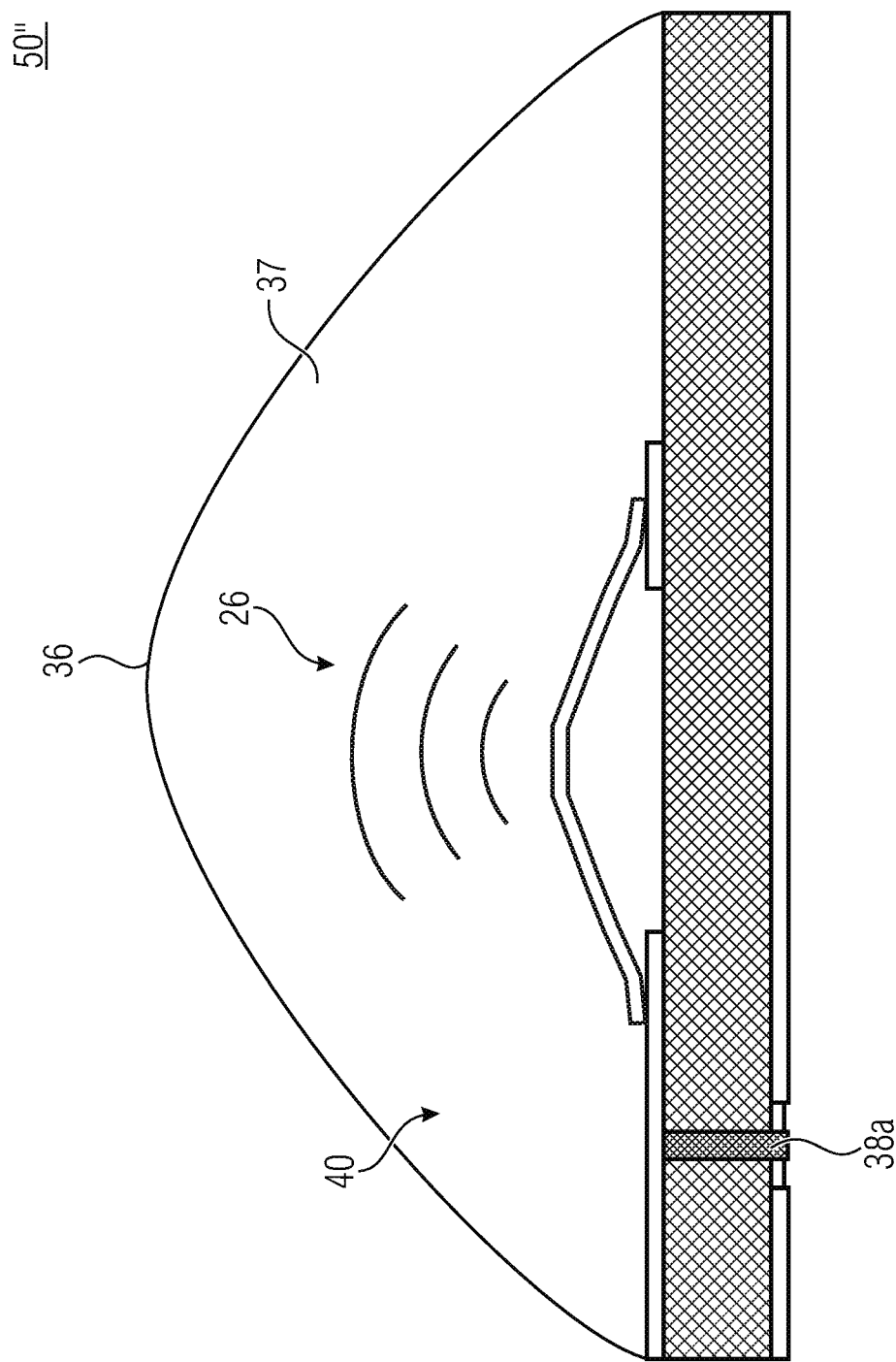
FIG. 5c shows a schematic side sectional view of an antenna apparatus according to an embodiment, in which the housing is implemented as a lens.

FIG. 5c shows a schematic side sectional view of an antenna apparatus 50" according to an embodiment, wherein the housing 36 is implemented as a lens, compared to FIG. 5b, which is configured to affect a radiation characteristic of the radio signal 26. For example, the lens may be configured to concentrate the radio signal 26. For example, the interior 37 of the housing 36 may be at least partially filled with a dielectric material, and an outer shape of the housing 36 may comprise a concave or convex shape in order to obtain a diffusing or concentrating function of the lens. This means that the housing may form a lens configured to concentrate or diffuse a radio signal 26 generated by the antenna apparatus.

Figure 6A:
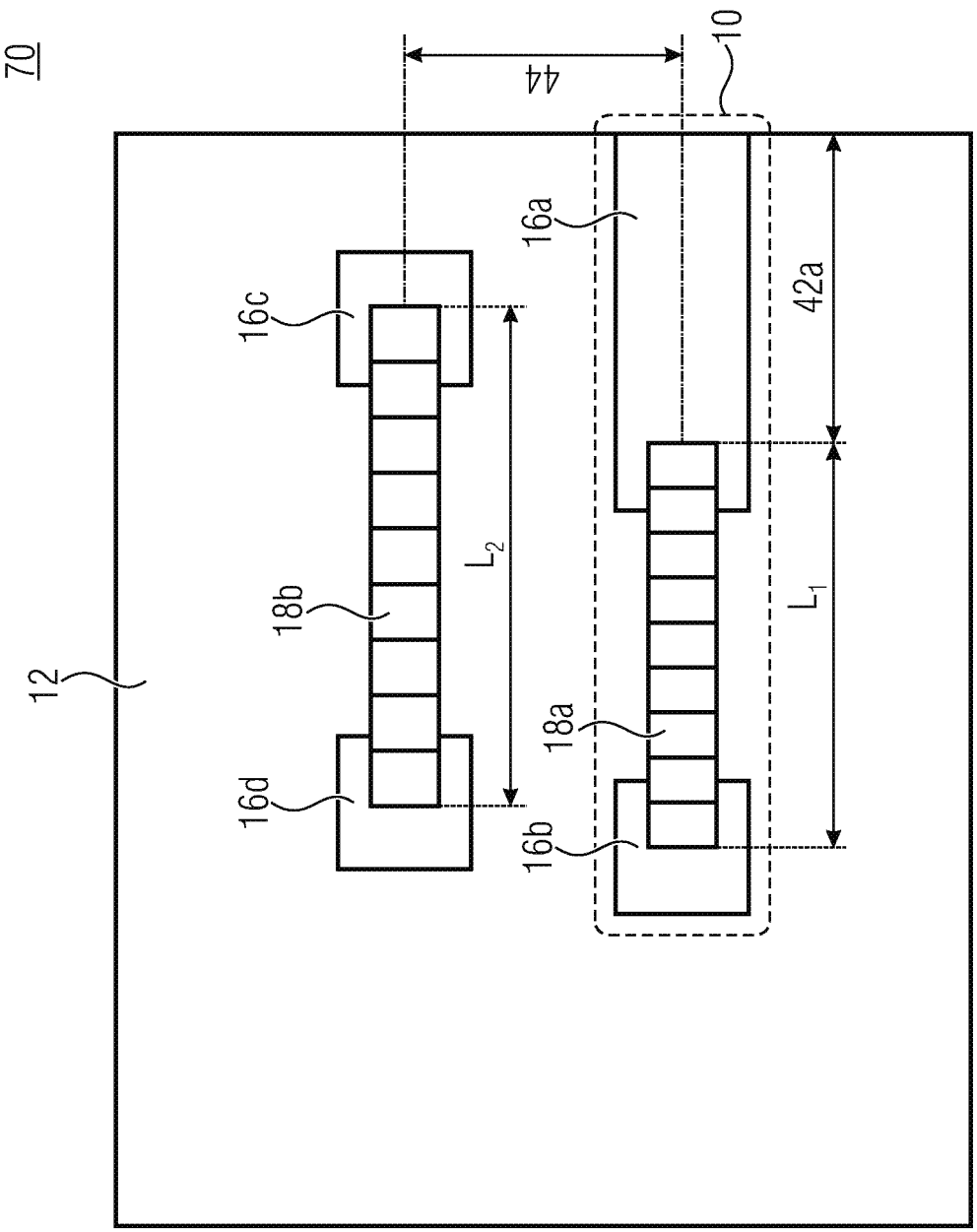
FIG. 6a shows a schematic top view of a further antenna array according to an embodiment.

FIG. 6a shows a schematic top view of a further antenna array 70 according to an embodiment. The antenna array 70 includes the antenna apparatus 10, in which the fixing region may simultaneously be used as a supply line. The antenna array 70 includes the ribbon 18b connecting two fixing regions 16c and 16d. The fixing regions 16c and 16d and the ribbon 18b are electrically or galvanically separated from the ribbon 18a of the antenna apparatus 10 of the antenna array 70. Alternatively or additionally to the antenna apparatus 10, the antenna array 70 may include the antenna apparatus 20, 30, 40 and/or 50. The ribbon 18b may comprise a length $L_2$ which is different to the length $L_1$ and/or to a sum of the lengths $L_1$ and the expansion 42a of the fixing region 16a. Furthermore, the ribbon 18b may be arranged with a distance 44 and approximately in parallel to the ribbon 18a. This enables an effect of the ribbon 18b as a director or reflector, which is known from so-called Yagi-Uda configurations including a driver element for generating the radio signal as well as at least one reflector element and at least one director element. This means that the ribbon 18b may also function as a reflector antenna or a director antenna by interacting with at least one of the ribbons of the antenna apparatus 10. Alternatively, the ribbon 18b may also be arranged in a different configuration as a passive radiator, wherein the distance 44, the length $L_2$ and/or an orientation of the ribbon 18b with respect to the ribbon 18a may be varied. Alternatively or additionally, the ribbon 18b may be part of an antenna apparatus including at least one ribbon. In this way, the ribbon 18b may be part of a further ribbon bond antenna such as the antenna apparatus 10 including one or several ribbons. Alternatively or additionally, the ribbon 18b may be part of another antenna apparatus. Also, a greater number of antenna apparatuses may be arranged in the array, wherein the antenna apparatuses may be formed in the same or in different ways.

The ribbon of the antenna apparatus of the array 70 may be extended by means of a further ribbon.

Thus, using an inventive antenna apparatus, almost any number of antenna arrays may be provided. For example, using the inventive antenna apparatus in combination with at least one further electrical conductor in a shape of a ribbon, as described above, several antenna array structures may be provided.

Figure 6B:
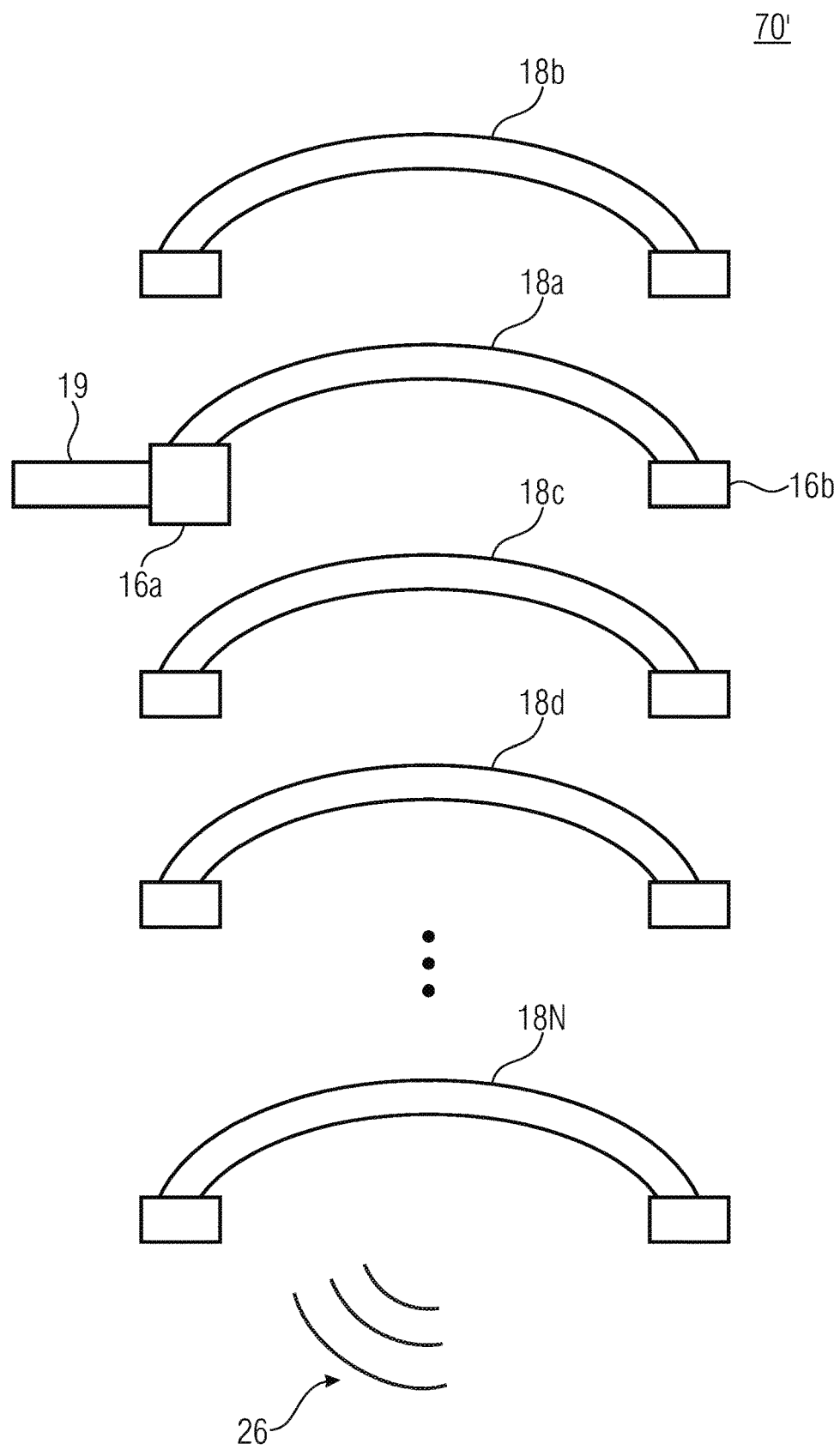
FIG. 6b shows a schematic top view of an antenna array according to an embodiment, which is implemented as a Yagi-Uda antenna.

FIG. 6b shows a schematic top view of an antenna array 70' according to an embodiment, which is implemented as a Yagi-Uda antenna. The ribbon 18a fed by the supply 19 is configured to generate the radio signal 26. The ribbon 18b is configured as a reflector element. Furthermore, an arbitrary number of ribbons 18c, 18d to 18N are each configured as a director element. The antenna 70' is configured to radiate the radio signal 26 along the director elements 18c, 18d to 18N, which means that a directivity may be obtained. A number of the director elements may be arbitrary. The antenna apparatus 70' may include at least one director element, at least two director elements, at least three director elements or a greater number such as five.

Although the antenna array 70' is illustrated such the reflector and director elements each include a ribbon 18b to 18N, each of these elements may be formed independently including a series circuit of ribbons.

Figure 7:
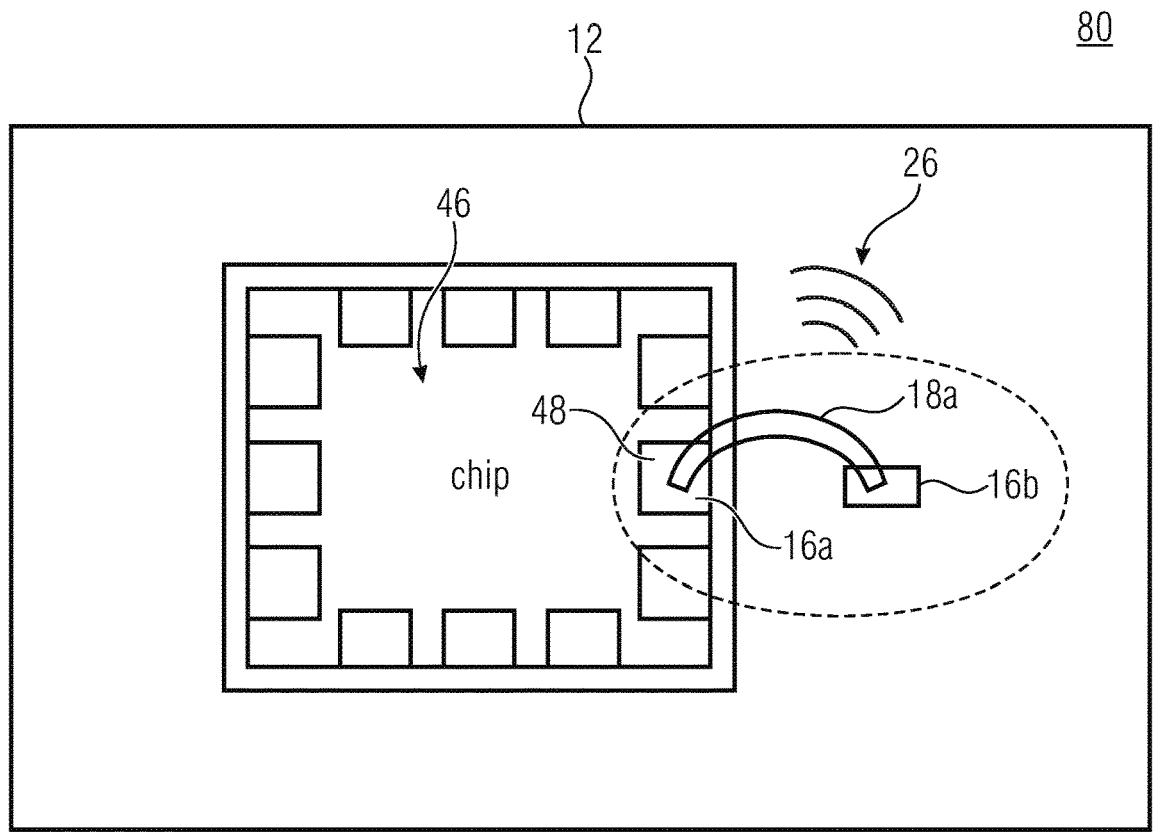
FIG. 7 shows a schematic top view of an electric circuit according to a further embodiment, in which the signal output of a radio-frequency chip may simultaneously be used as a fixing region.

FIG. 7 shows a schematic top view of an electric circuit 80 according to an embodiment. The electric circuit 80 includes the antenna apparatus 10. Alternatively or additionally, the antenna apparatus 20, 30, 40 and/or 50 or at least one of the antenna arrays 70 or 70' may be arranged. The electric circuit 80 further includes a radio-frequency chip 46 configured to provide a radio-frequency signal at a signal output or antenna port 48. The signal output 48 may, e.g., be a fixing region or a pin of the radio-frequency chip 46. The radio-frequency signal may, e.g., be the electric signal 24. The antenna apparatus 10 may be arranged with the radio-frequency chip 46 on the same substrate 12. The fixing region 16a may be connected via the ribbon 18a arranged between the signal output 48 and the fixing region 16b so that the antenna apparatus 10 provides the radio signal 26 in response to the signal obtained from the signal output 48.

The fixing region 16a may be the signal output 48 arranged on the chip.

Alternately or additionally, an electric connection may also be arranged between the signal output 48 and a terminal of a housing of the antenna apparatus, e.g., between the signal output 48 and the terminal 38a.

The radio-frequency chip 46 may be arranged on the substrate 12, e.g., by means of bonding, or may also be integrated into the substrate 12, which means being part of the substrate 12. In other words, the radio-frequency chip 46 may be arranged on the same plane as the substrate 12 or may be mounted on the substrate 12. In the embodiment of the electric circuit 80 the ribbon 18 connecting the radio-frequency chip 46 and the substrate 12 forms an antenna. A metallization serving as a return current path, e.g., the metallization 22, may be arranged on a second sheet of the substrate, e.g., a backside or an embedded layer.

The antenna array 80 may include a further ribbon electrically connecting the fixing region 16b and a further fixing region. This means that the fixing region 16a and the further fixing region may be electrically connected via the ribbon 18a, the fixing region 16b and the further ribbon. The conductor tapes may be connected to each other in series. The fixing regions may be arranged on the mutual substrate 12. Alternatively, the substrate 12 may be implemented in several pieces so that at least one of the fixing regions is arranged on another substrate than the remaining fixing regions.

A wavelength range of the radio signal may be affected by a sum of the series connection of the ribbons obtained in this manner and under consideration of the extensions, i.e., the length of the fixing regions. This means that a length of the fixing region 16a from a feeding point towards the ribbon 18a, a length of the ribbon 18a, and a distance on the fixing region 16b between the conductor tapes, and a length of the further ribbon possibly together with other structures such as vias affect the wavelength or resonance length of the radio signal. For example, the length of the fixing regions may be small or almost zero so that the influence of the distance becomes negligible.

Figure 8A:
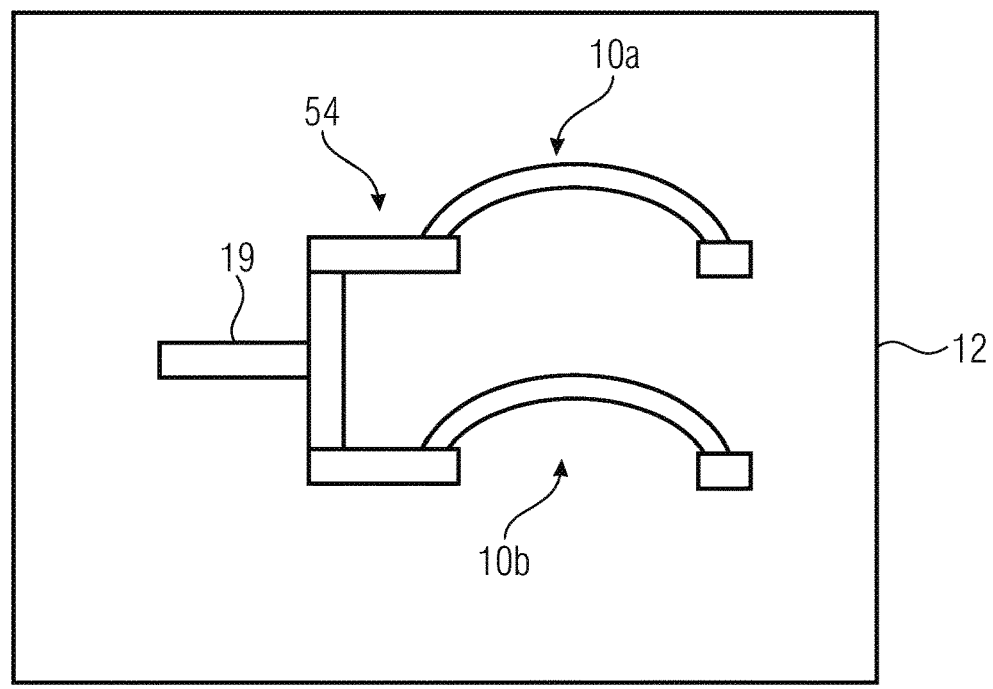
FIG. 8a shows a schematic block circuit diagram of an antenna array including a first antenna apparatus and a second antenna apparatus connected in parallel to each other.

FIG. 8 shows a schematic block circuit diagram of an antenna array 90 according to an embodiment, including a first antenna apparatus 10a and a second antenna apparatus 10b connected in parallel to each other. The antenna apparatuses 10a and 10b may mutually be supplied by the supply 19, wherein the antenna apparatuses 10a and 10b are interconnected in parallel via a voltage divider or power divider 54, and are connected to the power supply 19. This enables an identical drive of the antenna apparatuses 10a and 10b. The mutual supply of the antenna apparatuses 10a and 10b provides a further type of the reciprocal interaction between the antenna apparatuses. Compared to the array 70 or 70', one of the ribbons of the antenna apparatus 10a or 10b may be part of a second or further antenna apparatus. The antenna apparatuses may be galvanically connected via the power divider 42.

FIG. 8b shows a schematic view of an antenna array 90' according to an embodiment, including four antenna apparatuses 10a, 10b, 10c and 10d connected to the supply 19 a via network of voltage dividers or power dividers 54a, 54b and 54c. For example, one leg of a first power divider 54a may be connected to a further power divider 54b or 54c, respectively. A respective further leg may be connected to further power dividers or to one of the antenna apparatuses 10a-10d so that a total number of $2^N$ antenna apparatuses may be supplied, wherein N is a number of the stages of the network of power dividers.

Although the antenna arrays 90 and 90' have been described such that they include a multitude or plurality of antenna apparatuses 10, the arrays 90 or 90' may independently include other antenna apparatuses such as the antenna apparatus 20, 30, 40 and/or 50, i.e., combinations of different antenna apparatuses may also be arranged in the arrays 90 or 90'.

The shown configurations of the antenna apparatuses, the antenna arrays and the electric circuit are merely exemplary. By using conductor tapes as antenna elements, as described, any antenna configuration may be formed, e.g., a monopole antenna, a dipole antenna, or an array of antennas, and also loop antennas.

Even though some aspects have been described within the context of an apparatus, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device.

The above-described embodiments merely represent an illustration of the principles of the present invention. It is understood that other persons skilled in the art will appreciate modifications and variations of the arrangements and details described herein. This is why it is intended that the invention be limited only by the scope of the following claims rather than by the specific details that have been presented herein by means of the description and the discussion of the embodiments.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An antenna apparatus comprising:
a substrate comprising a first main side and a second main side arranged opposite thereto;
a first and a second fixing region arranged at the first main side;
a ribbon connecting the first fixing region and the second fixing region, which is at least regionally spaced apart from the substrate; and
a metallization arranged at the second main side, which is arranged opposite to at least one of the first fixing region, the second fixing region and the ribbon.

2. The antenna device according to claim 1, configured to emit a radio signal with the ribbon in response to an electric signal applied at the first fixing region, wherein a wavelength range of the radio signal is affected by a length of the ribbon.

3. The antenna apparatus according to claim 1, wherein the metallization arranged at the second main side is discontinuously implemented across the second main side.

4. The antenna apparatus according to claim 1, wherein the metallization arranged at the second main side is arranged opposite to the first fixing region, the second fixing region and the ribbon.

5. The antenna apparatus according to claim 1, wherein the metallization arranged at the second main side is a reflector for a radio signal emitted by the ribbon.

6. The antenna apparatus according to claim 1, wherein the second fixing region and the metallization arranged at the second main side are connected through the substrate via an electrically conductive structure.

7. The antenna apparatus according to claim 6, wherein a wavelength range of a radio signal emitted with the ribbon and the conductive structure is affected by a sum of a length of the ribbon and a length of the conductive structure.

8. The antenna apparatus according to claim 1, wherein the first fixing region is implemented as a strip line, wherein a wavelength range of a radio signal emitted with the ribbon and the strip line is affected by a sum of a length of the ribbon and a length of the strip line.

9. The antenna apparatus according to claim 1, wherein the second fixing region at least partially encloses the first fixing region so that the first fixing region acts as a coplanar supply line with respect to the second fixing region.

10. The antenna apparatus according to claim 1, further comprising a housing, in which the antenna apparatus is arranged and which comprises a terminal for connecting the antenna apparatus to a radio-frequency chip.

11. The antenna apparatus according to claim 10, wherein the housing forms a lens configured to concentrate or diffuse a radio signal generated by the antenna apparatus.

12. The antenna apparatus according to claim 1, comprising a terminal for vertically feeding or for horizontally feeding, and configured to provide a radio signal based on an electric signal received via the terminal.

13. An antenna array comprising at least one antenna apparatus according to claim 1, wherein the ribbon is a first ribbon, the antenna array comprising at least one second ribbon interacting with the first ribbon.

14. The antenna array according to claim 13, wherein the first and the second ribbon are electrically connected in series so that a wavelength range of a radio signal emitted with the antenna array is affected by a sum of a length of the first ribbon and a length of the second ribbon.

15. The antenna array according to claim 13, wherein the first and the second ribbon are galvanically separated from each other and are arranged with respect to each other such that the second ribbon acts as a reflector antenna or as a director antenna with respect to the first ribbon.

16. The antenna array according to claim 13, wherein the antenna apparatus is a first antenna apparatus and wherein the second ribbon is part of a second antenna apparatus, the first antenna apparatus and the second antenna apparatus being connected via a power divider.

17. An electric circuit, comprising:
an antenna apparatus according to one of claim 1;
a radio-frequency chip configured to provide a radio-frequency signal at a signal output, and arranged on the substrate of the antenna apparatus;
wherein the first fixing region is electrically connected to the signal output or wherein the signal output is the first fixing region.

18. The electric circuit according to claim 17, wherein the first fixing region is connected to the signal output through a bond wire or a ribbon.

* * * * *